(12) United States Patent
Goel

(10) Patent No.: US 8,561,001 B1
(45) Date of Patent: Oct. 15, 2013

(54) SYSTEM AND METHOD FOR TESTING STACKED DIES

(75) Inventor: Sandeep Kumar Goel, Dublin, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/546,033

(22) Filed: Jul. 11, 2012

(51) Int. Cl.
| | | |
|---|---|---|
| *G06F 17/50* | (2006.01) | |
| *G06F 12/00* | (2006.01) | |
| *G06F 13/38* | (2006.01) | |
| *G11C 11/4063* | (2006.01) | |
| *G11C 11/4193* | (2006.01) | |
| *G11C 16/32* | (2006.01) | |
| *G11C 7/22* | (2006.01) | |
| *G11C 8/18* | (2006.01) | |
| *G11B 19/04* | (2006.01) | |
| *G06F 13/40* | (2006.01) | |
| *G11C 11/419* | (2006.01) | |

(52) U.S. Cl.
CPC ........ *G06F 17/5077* (2013.01); *G06F 17/5072* (2013.01); *G06F 17/5054* (2013.01); *G06F 12/00* (2013.01); *G06F 13/4004* (2013.01); *G11C 11/4063* (2013.01); *G11C 11/419* (2013.01); *G11C 16/32* (2013.01); *G11C 7/222* (2013.01); *G11C 8/18* (2013.01); *G11B 19/04* (2013.01)
USPC ........... 716/130; 716/119; 716/129; 716/134; 716/138; 365/185.09; 365/210.11; 365/233.12; 369/30.22; 369/47.14; 369/47.44; 711/101; 711/154; 711/210

(58) Field of Classification Search
CPC ............ G06F 17/5077; G06F 17/5072; G06F 17/5054; G06F 12/00; G06F 13/4004; G11C 11/4063; G11C 11/419; G11C 16/32; G11C 7/222; G11C 8/18; G11B 19/04
USPC .......... 716/119, 130, 129, 134, 138; 365/185.09, 210.11, 233.12; 369/30.22, 47.14, 47.44; 711/101, 154, 711/210
See application file for complete search history.

(56) References Cited

U.S. PATENT DOCUMENTS

| | | | | |
|---|---|---|---|---|
| 5,986,491 A | * | 11/1999 | Grehl et al. .................... | 327/239 |
| 7,557,606 B1 | * | 7/2009 | Chen et al. ...................... | 326/38 |
| 2003/0147298 A1 | * | 8/2003 | Ooishi et al. ................... | 365/233 |
| 2004/0210857 A1 | * | 10/2004 | Srinivasan ........................ | 716/2 |
| 2005/0283671 A1 | * | 12/2005 | Stave ............................... | 714/31 |
| 2006/0253738 A1 | * | 11/2006 | Stave ............................... | 714/31 |
| 2008/0112520 A1 | * | 5/2008 | Gundurao et al. ............. | 375/354 |
| 2008/0191773 A1 | * | 8/2008 | Oh ................................. | 327/276 |
| 2009/0106718 A1 | * | 4/2009 | Matsumoto et al. .............. | 716/6 |

(Continued)

OTHER PUBLICATIONS

Li et al., "Exploratory Study on Circuit and Architecture Design of Very High Density Diode-Switch Phase Change Memories", $10^{th}$ International Symposium on Quality Electronic Design, IEEE, 2009, pp. 424-429.*

(Continued)

*Primary Examiner* — Phallaka Kik
(74) *Attorney, Agent, or Firm* — Duane Morris LLP

(57) ABSTRACT

Systems and methods are disclosed for testing dies in a stack of dies and inserting a repair circuit which, when enabled, compensates for a delay defect in the die stack. Intra-die and inter-die slack values are determined to establish which die or dies in the die stack would benefit from the insertion of a repair circuit.

7 Claims, 5 Drawing Sheets

(56) References Cited

U.S. PATENT DOCUMENTS

| | | | |
|---|---|---|---|
| 2009/0259979 A1* | 10/2009 | Smith | 716/6 |
| 2012/0174049 A1* | 7/2012 | Lin et al. | 716/113 |
| 2012/0284679 A1* | 11/2012 | Tetelbaum | 716/113 |
| 2012/0306551 A1* | 12/2012 | Moon et al. | 327/149 |
| 2013/0088256 A1* | 4/2013 | Chlipala et al. | 326/16 |

OTHER PUBLICATIONS

Su et al., "An Integrated ECC and Redundancy Repair Scheme for Memory Reliability Enhancement", Proceedings of the 2005 20$^{th}$ IEEE International Symposium on Defect and Fault Tolerance in VLSI Systems, IEEE, 2005, pp. 1-9.*

* cited by examiner

US 8,561,001 B1

SYSTEM AND METHOD FOR TESTING STACKED DIES

BACKGROUND

Three-dimensional ("3D") and/or 2.5D integrated circuits ("ICs") are becoming more prevalent in semiconductor architecture. The increased density of dies and the costs associated with manufacturing these dies dictates that the testing performed on dies must make full use of all good dies. Current testing schemes that test one die at a time as if each die was to be used as a stand-alone chip do not take into account the reality that dies may be stacked together and operated as a stack. Thus, a die that may fail a typical testing regime, for example a testing regime which includes an at-speed test that checks for the existence of delays in the die, would typically be discarded. Such testing regimes, when taking into account the reality that dies may be stacked together and operated as a stack, may unnecessarily inflate die failure rate and, therefore, costs.

Faults within a die can generally be classified into one of two categories: hard defects and weak defects. Hard defects, such as stuck faults, are typically easy to detect and generally are those types of faults that are always present and cause permanent failure. Weak defects, on the other hand, are harder to detect and may cause additional delay in a circuit within the die based on the defect size. Examples of weak defects include a resistive via and a partial missing connection between components within the die. Each of these, and other, types of weak defects induce a timing delay within the die.

Each die, whether operated in a stand-alone manner or as part of a stack of dies, typically has a timing budget which may include slack time, e.g., the time between when a data bit reaches a data storage circuit and the time when the data storage circuit latches the data bit before sending the latched data bit off to the next component, either within the same die or to another die in the stack of dies. In most instances, each die in a stack of dies operates within its own clock domain. Since the different clock domains for dies within a stack of dies are not necessarily exactly synchronized, there exists an opportunity to make advantageous use of the timing differences between dies within a stack of dies.

DETAILED DESCRIPTION

With reference to the figures where like elements have been given like numerical designations to facilitate an understanding of the present subject matter, various embodiments of a system and method for testing dies in a stack of dies and for compensating for a delay defect in a die in a die stack are described. Additionally, systems and methods are disclosed for inserting a repair circuit which, when enabled, compensates for a delay defect in the die stack. Intra-die and inter-die slack values are determined to establish which die or dies in the die stack would benefit from the insertion of a repair circuit. In order to more fully understand the present subject matter, a brief description of applicable circuitry will be helpful.

Figure 1:
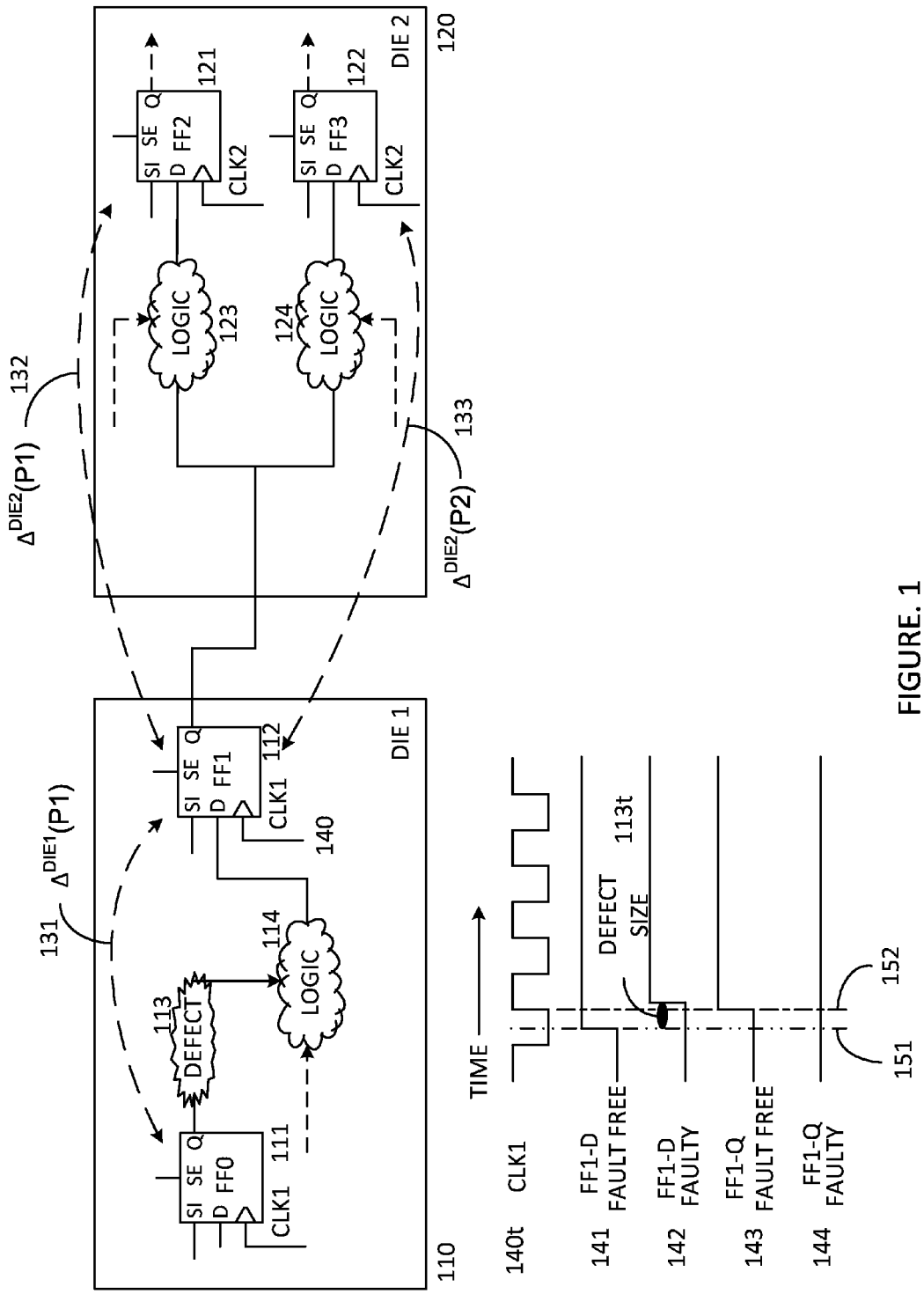
FIG. 1 is a block diagram representation of two dies in a prior art die stack showing a defect in one of the dies, and an exemplary timing chart for the die with the defect.

FIG. 1 is a block diagram representation of two dies in a prior art die stack showing a defect in one of the dies, and an exemplary timing chart for the die with the defect. Die 1, 110, and Die 2, 120, are shown as part of a die stack. Die 1 includes a data storage circuit 111, designated FF0, and a data storage circuit 112, designated FF1. These data storage circuits may be of any type known in the art including, but not limited to, flip-flops, latches, and scan flip-flops (which may contain both data and scan/test input). Although FF0 and FF1 are depicted as being the same type of data storage circuit, FF0 and FF1 need not necessarily be the same. In the embodiment depicted in FIG. 1, FF0 is a scan flip-flop for data entering Die 1 and FF1 is a scan flip-flop for data exiting Die 1 and being sent to Die 2. As is known in the art, FF0 and FF1 each include input and output lines. Of interest to the present subject matter, one of those inputs includes a clock signal, designated herein as CLK1, as shown. For FF1, the clock signal CLK1 is designated 140. Another of the inputs is a data input designated as "D" in FF0 and FF1, as shown. A data output line from FF0 and FF1 is designated as "Q" in FF0 and FF1, as shown.

Die 1 also includes logic circuitry 114. The data output of FF0, designated herein as FF0-Q, is input to the logic circuitry 114. However, defect 113 exists in the connection between FF0-Q and logic circuitry 114. The defect 113 injects delay between FF0 and FF1, as discussed in more detail below.

Within Die 1, the path between FF0 and FF1 has a timing budget, or timing margin, which can be determined by known methods, and is designated as $\Delta^{DIE1}(P1)$ otherwise referred to as path slack 131. Since path slack 131 is completely within Die 1, path slack 131 is an intra-die path slack.

Considering Die 2, Die 2 includes data storage circuit 121, designated FF2, and data storage circuit 122, designated FF3. FF2 and FF3 are data storage circuits which, in certain embodiment, are similar to FF0 and FF 1, discussed above. Die 2 also includes logic circuitry 123 on the data input line to FF2, and logic circuitry 124 on the data input line to FF3. FF2 and FF3 are clocked with a clocking signal designated CLK2 which may be the same as CLK1 or may be a different clock signal than CLK1. Thus, Die 1 and Die 2 operate in separate clock domains. In certain embodiments, the clock signal for FF2 may be different than the clock signal for FF3.

In operation, the output of FF1, FF1-Q, is input to FF2 and FF3 via logic circuitry 123 and 124, respectively, on the data input lines FF2-D and FF3-D, respectively. The path between FF1 and FF2 has a timing budget, or timing margin, which can be determined by known methods, and is designated as $\Delta^{DIE2}(P1)$ otherwise referred to as path slack 132. Since path slack 132 traverses Die 1 and Die 2, path slack 132 is an inter-die path slack. Similarly, the path between FF1 and FF3 has a timing budget, or timing margin, which can be determined by known methods, and is designated as $\Delta^{DIE2}(P2)$ otherwise referred to as path slack 133. Since path slack 133 traverses Die 1 and Die 2, path slack 133 is an inter-die path slack.

With attention now directed towards the timing chart in FIG. 1, various timing events are depicted, with time traveling from left to right, as shown. Graph 140t shows a typical signal for CLK1. Graph 141 shows a notional data signal arriving at the data input line D of FF1, i.e., FF1-D, from the data output Q of FF0, i.e., FF0-Q, via logic circuitry 114. As shown, the data arrives at FF1-D, as shown by line 151, prior to the rising edge of clock signal CLK1, as shown by line 152. In the embodiment shown, the rising edge of CLK1 triggers FF1 so that the signal present at FF1-D at that time is latched, as shown in graph 143 for the output data from FF1, FF1-Q. Note that as shown in graph 141, the defect 113 is not present.

Graph 142 shows a similar notional data signal arriving at FF1-D from FF0-Q via logic circuitry 114 but in this case defect 113 causes a delay, defect size 113t, in the reception of the data signal at FF1-D. The effect of the delay inserted by defect 113 causes the data signal to arrive at FF1-D after the rising edge of CLK1, as shown by line 152. As discussed above, the reception of the rising edge of CLK1 triggers FF1 so that the signal present at FF1-D at that time is latched. However, due to the time delay 113t injected by defect 113, the data signal from FF0-Q has not yet arrived at FF1-D when CLK1 triggers FF1. Consequently, as shown in graph 144, FF1 latches an incorrect data reading at FF1-Q and, at the appropriate clock signal, FF1-Q sends a faulty data signal to Die 2.

Figure 2:
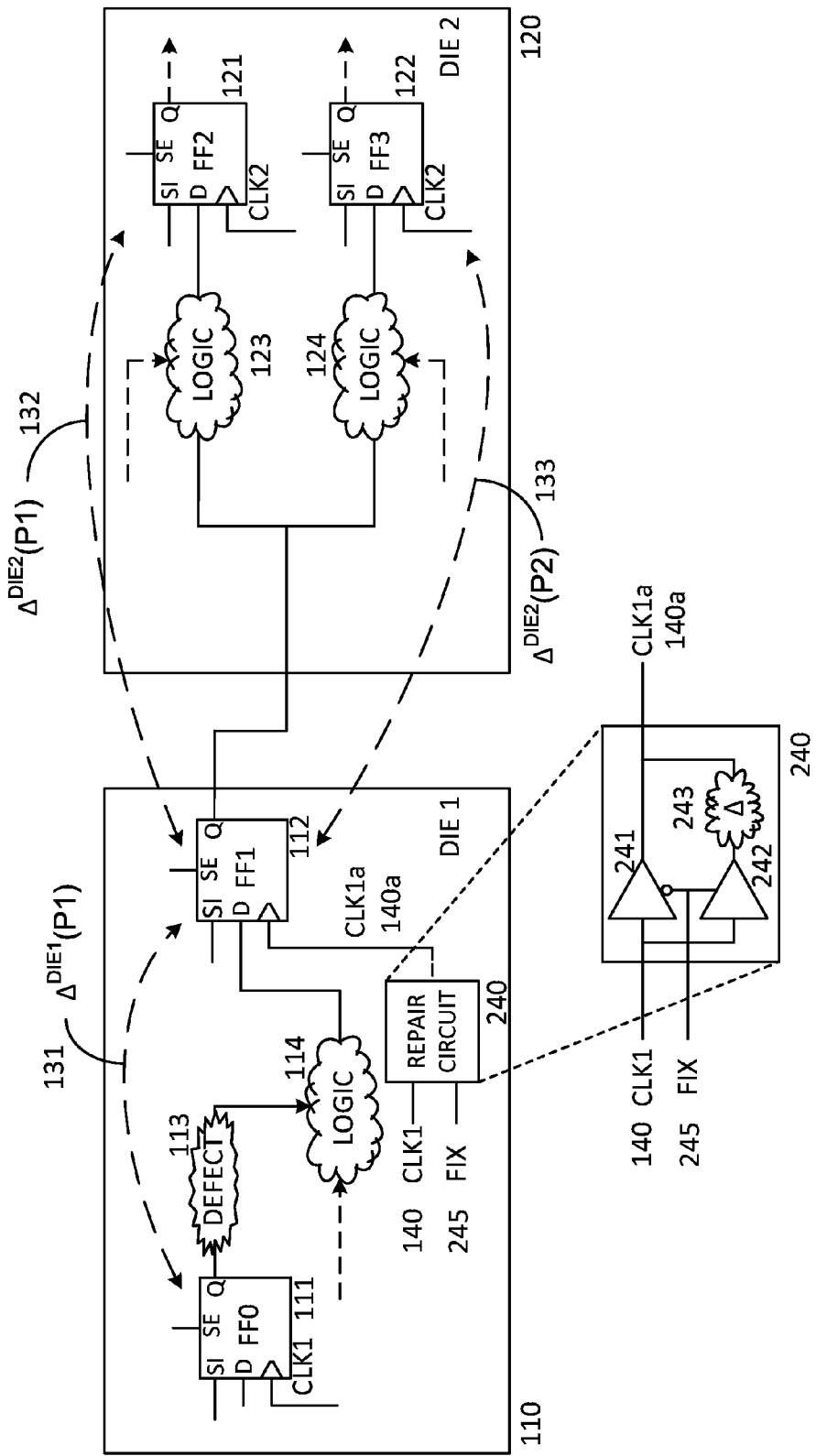
FIG. 2 is a block diagram representation of two dies in a die stack showing an exemplary repair circuit in the die with a defect, according to an embodiment of the present subject matter.

FIG. 2 is a block diagram representation of the two dies in a die stack shown in FIG. 1 with the inclusion of an exemplary repair circuit 240 in Die 1. The description of Die 1 and Die 2, and their internal components and pathways, are as described above for FIG. 1.

Regarding Die 1 in FIG. 2, the repair circuit 240 is placed in the clock line for FF1, as shown. The clock signal CLK1, 140, is input into repair circuit 240 rather than directly into FF1. The repair circuit 240 also has an input for a "FIX" signal 245, the purpose of which will be explained below. The inset of FIG. 2 shows an exemplary circuit architecture for repair circuit 240 including circuits 241 and 242 and delay 243, which includes a delay value "Δ". In the absence of FIX signal 245, repair circuit 240 operates to pass clock signal CLK1, without adding delay 243, to FF1 as clock signal CLK1a, 140a. In the presence of FIX signal 245, repair circuit 240 operates to pass clock signal CLK1 to FF1, but adds delay 243, as clock signal CLK1a. It will be readily understood by those of skill in the art that the exemplary circuit architecture shown for repair circuit 240 is non-limiting in nature and other circuit architectures that operate in a similar manner to the description above for repair circuit 240 are contemplated herein.

The amount of delay added to clock signal CLK1 by delay 243 depends on the timing margin available in slack path 132 and slack path 133. If the delay injected by defect 113 is less than both of the timing margins available in slack paths 132 and 133, then the timing margin in the shorter of slack paths 132 or 133 may be "borrowed" by delay 243 in repair circuit 240 to overcome the effects resulting from delay 113 in Die 1. Thus the maximum value of the delay "a" in delay 243 is as follows:

$$\Delta \leq \min(\Delta^{DIE2}(P1), \Delta^{DIE2}(P2), \ldots)$$

While only two inter-die slack paths are shown in FIG. 2, more than two inter-die slack paths are contemplated by the present subject matter. Once the maximum delay value for "Δ" is determined, the value of Δ may be set to a predetermined value less than or equal to the maximum. Alternatively, Δ may be selectable between a number of predetermined values and, further, may be programmable by known methods, where the programmed values need not be hard-wired into the repair circuit 240. Naturally, if the amount of delay injected by defect 113 is less than the slack value in intra-die slack path 131, then repair circuit 240 need not be enabled to introduce delay 243 into the clock signal CLK1a for FF1.

Figure 3:
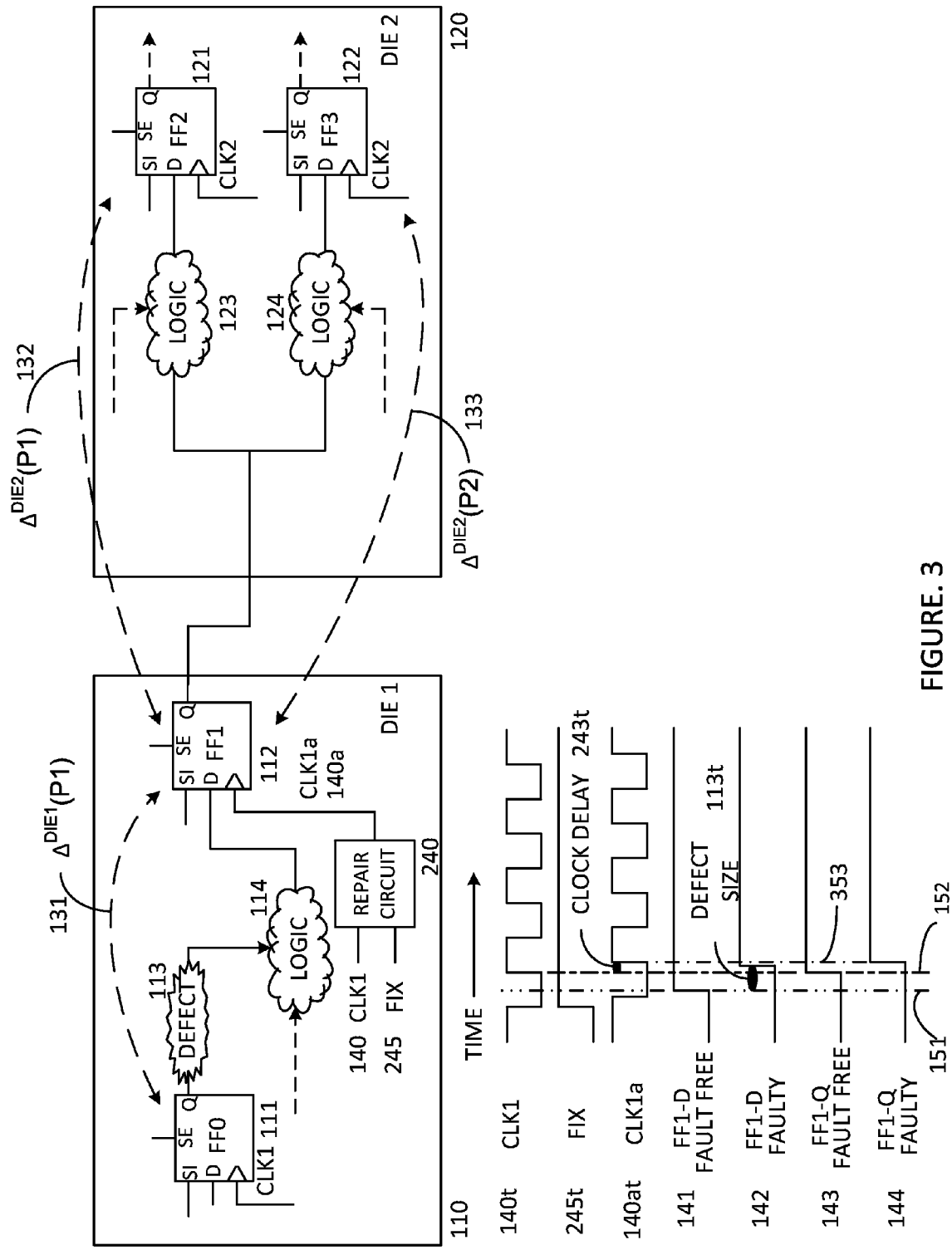
FIG. 3 is a block diagram representation of two dies in a die stack showing an exemplary repair circuit in the die with a defect, and an exemplary timing chart for the die with the defect, according to an embodiment of the present subject matter.

With focus now on FIG. 3, a block diagram representation of the two dies in a die stack shown in FIG. 2 is presented. The description of Die 1 and Die 2, and their internal components and pathways, are as described above for FIG. 2 and will not be repeated here. In addition to Die 1 and Die 2, FIG. 3 illustrates an exemplary timing chart for Die 1, showing both the effect of defect 113 and the effect of repair circuit 240. Time progresses from left to right, as shown.

Graph 140t shows a typical signal for CLK1, as described above in FIG. 1. Graph 245t shows a notional FIX signal which will enable repair circuit 240 to insert a clock delay 243t (referred to as delay A for device 243 as described above with respect to FIG. 2). Graph 140 at shows the output of the repair circuit 240, delayed clock signal CLK1a which is input into FF1, with the insertion of clock delay 243t. Note that the clock signal CLK1a is delayed from clock signal CLK1 by the amount of clock delay 243t.

Graph 141, as described above in FIG. 1, shows a notional data signal arriving at the data input line D of FF1, i.e., FF1-D, from the data output Q of FF0, i.e., FF0-Q, via logic circuitry 114. As shown, the data arrives at FF1-D, as shown by line 151, prior to the rising edge of clock signal CLK1, as shown by line 152. Since, when repair circuit 240 is enabled, clock signal CLK1a is delayed from clock signal CLK1, the data arrives at FF1-D, as shown by line 151, prior to the rising edge of clock signal CLK1a. Note that as shown in graph 141, the defect 113 is not present.

Graph 142, as described above in FIG. 1, shows a similar notional data signal arriving at FF1-D from FF0-Q via logic circuitry 114 but in this case defect 113 injects a delay, defect size 113t, in the reception of the data signal at FF1-D. While the effect of the delay inserted by defect 113 causes the data signal to arrive at FF1-D after the rising edge of CLK1, as shown by line 152, since FF1 is now clocked by CLK1a (when repair circuit 240 is enabled), which is delayed from CLK1, the data signal arrives at FF1-D prior to the rising edge of CLK1a, as shown by line 353. Since the reception of the rising edge of CLK1a now triggers FF1, the signal present at FF1-D at the time of reception of the rising edge of CLK1a is latched, which, as shown in the exemplary timing charts, is the correct value. This is shown in graph 144 where FF1 latches the correct data value at the rising edge of clock signal CLK1a as shown by line 353. Thus, the correct data value appears at FF1-Q for transmission to Die 2.

Accordingly, the insertion of clock delay 243t when repair circuit 240 is enabled overcomes the effect of the delay injected by defect 113. Thus, while Die 1 may have failed timing tests when operated as a stand-alone chip and therefore been rejected, when Die 1 is operated in a die stack and Die 1 includes a repair circuit 240, the operation of Die 1 is acceptable and need not be rejected. Therefore, a die stack which combines a non-acceptable die (on its own) with one or more good dies results in a die stack which is acceptable reducing unnecessary yield loss.

As contemplated by embodiments of the present subject matter, repair circuit 240 may be implemented in a cascade fashion such that, for example, a single FIX signal may be used to enable more than one cascaded repair circuit. Additionally, testing of the different dies in a stack may result in a list of available slack paths which may be used to reorder the dies, for example, in order of increasing slack. Thus, it is then possible to add a repair circuit to a minimum number of dies in the die stack with a minimum of slack "borrowing" between dies.

Figure 4:
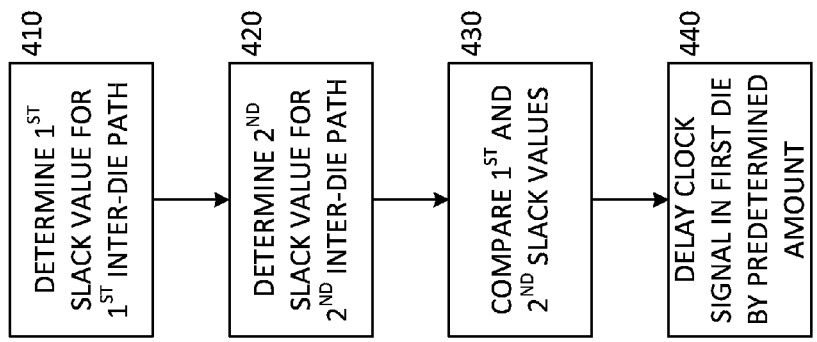
FIG. 4 is a flow chart for a method for compensating for a delay defect in a die in a die stack according to an embodiment of the present subject matter.

Considering FIG. 4, a flow chart is presented for a method for compensating for a delay defect in a die in a die stack according to an embodiment of the present subject matter. At block 410, a first slack value for a first inter-die path between a first and a second die in a die stack is determined. The first inter-die path begins at a first circuit in the first die, such as a flip-flop, latch, or scan flip-flop. At block 420, a second slack value for a second inter-die path between the first and second dies in the die stack is determined. The second inter-die path also begins at the first circuit in the first die. At block 430, the first slack value is compared to the second slack value. At block 440, a clock signal to a data storage circuit in the first die is delayed by a predetermined amount. Of course, one of skill in the art will readily understand that the above procedure can be expanded to any number of inter-die paths beginning at, for example, the first circuit in the first die.

Figure 5:
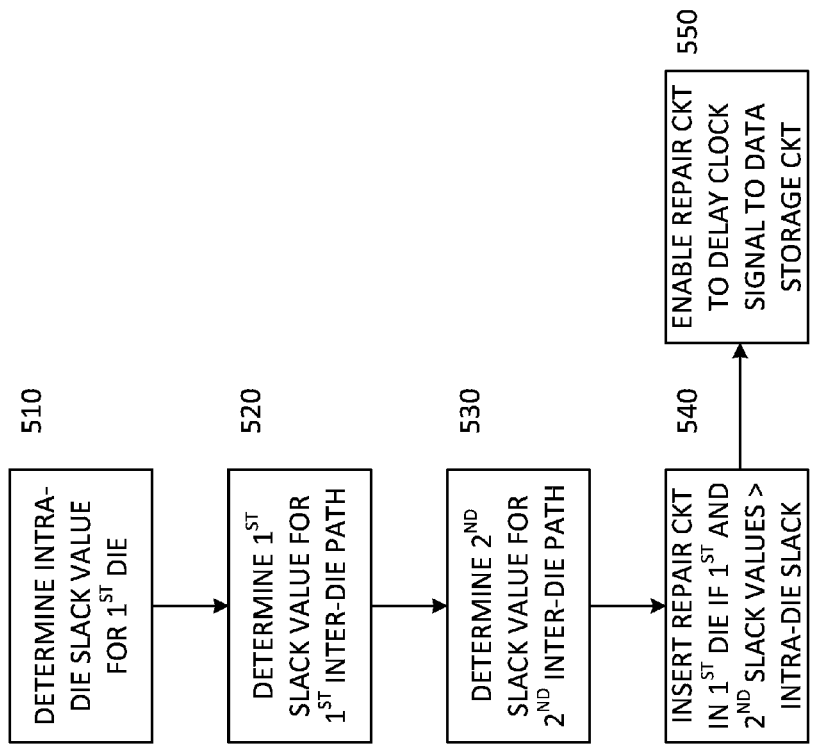
FIG. 5 is a flow chart for a method for testing a die stack according to an embodiment of the present subject matter.

Considering FIG. 5, a flow chart is presented for a method for testing a die stack according to another embodiment of the present subject matter. At block 510, an intra-die slack value for a first die in a die stack is determined. At block 520, a first slack value for a first inter-die path between the first die and a second die in the die stack is determined. At block 530, a second slack value for a second inter-die path between the first and second dies is determined. At block 540, a repair circuit is inserted in the first die if both the first slack value and the second slack value are greater than the inter-die slack value. In an additional embodiment, the repair circuit is enabled so as to delay a clock signal to a data storage circuit in the first die by a predetermined amount.

In an embodiment, a two-step procedure is followed for testing a die stack. As a first step, a determination is made regarding whether a repair circuit should be inserted in a die in the die stack, such as repair circuit 240 placed in the clock line for FF1, as shown in FIG. 2. As a second step, the stack is tested (without the repair circuit enabled) and if the stack fails the test, a determination is made as to whether the failing flop (e.g., FF1 in FIG. 2) has had a repair circuit added. If the failing flop has had a repair circuit added, the repair circuit is enabled and the test is run again. If the stack passes the second test run, then the die in which the repair circuit was added is considered to be a good die. If the stack fails the second test run, or if no repair circuit had been added to the failing flop, the die with the failing flop is discarded as a bad die.

In an embodiment, an exemplary procedure for the first step (inserting a repair circuit) described above is as follows:

```
D: set of dies in the stack
for each die d_i in D {
    P(d_i) = { }; P(d_i) = get_critical_paths(d_i)
    for each path p in P(d_i) {
        f = get_end_flop (p)
        s_min = 0;
        for each die d_{k(k≠i)} in D {
            P(d_i,d_k) = { }; P(d_i,d_k) = get_inter_die_critical_path (f,d_i,d_k);
            for each path sp in P(d_i,d_k) {
                slack = get_slack_for path (sp);
                if (s_min > slack) {s_min = slack};
            }
        }
        insert proposed repair circuitry at flop f with maximum allowed
            delay as s_min
    }
}
```

Those of skill in the art will understand that other similar procedures are contemplated by the present subject matter and that the above exemplary procedure for the first step is not intended to limit the present subject matter in any way.

In an embodiment, an exemplary procedure for the second step (testing the die stack) described above is as follows:

```
D: set of dies in the stack
for each die d_i in D {
    P = generate_test_patterns(d_i);
    apply test patterns on ATE;
    if test pass {
        good_die = true; goto NEXT_DIE;}
    else {
        die_repair = false;
        for each failing pattern p_i{
            f = get_failing_flop(p_i);
            if(has_repair_circuit(f) == true) {
                enable the repair and retest the pattern;
                if(pattern fail) {
                    good_die = false; goto NEXT_DIE;}
                else {good_die = true;}
            }
            else {
                good_die = false; goto NEXT_DIE;}
        }
    }
    NEXT_DIE: if(good_die == true) {mark die as good die;}
        else {mark die as defective die;}
}
```

Those of skill in the art will understand that other similar procedures are contemplated by the present subject matter and that the above exemplary procedure for the second step is not intended to limit the present subject matter in any way. In the above exemplary procedure, "ATE" is "Automatic Test Equipment", as is known in the art.

According to an embodiment of the present subject matter, a method for compensating for a delay defect in a die stack includes determining a first slack value for a first inter-die path between a first and a second die in the die stack; determining a second slack value for a second inter-die path between the first and second dies; comparing the first slack value to the second slack value; and delaying a clock signal to a data storage circuit in the first die by a predetermined amount.

According to another embodiment of the present subject matter, a method for testing a die stack includes determining an intra-die slack value for a first die in the die stack; determining a first slack value for a first inter-die path between the first die and a second die in the die stack; determining a second slack value for a second inter-die path between the first and second dies; and inserting a repair circuit in the first die if both the first slack value and the second slack value are greater than the intra-die slack value.

According to yet another embodiment of the present subject matter, a system for compensating for a delay defect in a die stack having a first and a second die includes a first die having a first data storage circuit, a first path for passing information to the first data storage circuit where the first path has a first path slack value and a known defect value, and a repair circuit operatively connected to the first data storage circuit. The second die, which is operatively connected to the first die, includes a second data storage circuit, and a second path for passing information from the first data storage circuit to the second data storage circuit, where the second path has a second path slack value. In operation, the repair circuit delays a clock signal to the first data storage circuit by a predetermined amount if the defect value is greater than the first path slack value and if the defect value is less than or equal to the second path slack value.

While some embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

I claim:

1. A system for compensating for a delay defect in a die stack having a first and a second die, the system comprising:
    said first die comprising:
    a first data storage circuit;
    a first path for passing information to said first data storage circuit, said first path having a first path slack value and said first path having a known defect value; and
    a repair circuit operatively connected to said first data storage circuit;
    and
    said second die operatively connected to said first die, said second die comprising:
    a second data storage circuit; and
    a second path for passing information from said first data storage circuit to said second data storage circuit, said second path having a second path slack value,
    wherein said repair circuit delays a clock signal to said first data storage circuit by a predetermined amount if said defect value is greater than said first path slack value and if said defect value is less than or equal to said second path slack value.

2. The system of claim 1 wherein said second die further comprises:
    a third data storage circuit; and
    a third path for passing information from said first data storage circuit to said third data storage circuit, said third path having a third path slack value,
    wherein said third path slack value is greater than said second path slack value.

3. The system of claim 1 wherein said predetermined amount is programmable.

4. The system of claim 1 wherein said predetermined amount is selectable.

5. The system of claim 1 wherein said predetermined amount is approximately equal to the smaller of the second path slack value and a third path slack value wherein said third path slack value is associated with a third path for passing information from said first data storage circuit to a third data storage circuit in said second die.

6. The system of claim 1 wherein said first die operates in a first clock domain and said second die operates in a second clock domain.

7. The system of claim 6 wherein said first data storage circuit is a scan flip-flop circuit which sends a data signal from said first die to said second die responsive to a clock signal in said first clock domain.

* * * * *